(12) United States Patent
Hackley et al.

(10) Patent No.: US 12,354,988 B2
(45) Date of Patent: Jul. 8, 2025

(54) BUMP STRUCTURES FOR LOW TEMPERATURE CHIP BONDING

(71) Applicants: Justin C. Hackley, Catonsville, MD (US); Jeffrey David Hartman, Severn, MD (US)

(72) Inventors: Justin C. Hackley, Catonsville, MD (US); Jeffrey David Hartman, Severn, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 474 days.

(21) Appl. No.: 17/745,363

(22) Filed: May 16, 2022

(65) Prior Publication Data
US 2023/0369270 A1    Nov. 16, 2023

(51) Int. Cl.
*H01L 23/00*    (2006.01)
(52) U.S. Cl.
CPC .............. *H01L 24/16* (2013.01); *H01L 24/13* (2013.01); *H01L 24/81* (2013.01); *H01L 2224/13099* (2013.01); *H01L 2224/13144* (2013.01); *H01L 2224/13147* (2013.01); *H01L 2224/13166* (2013.01); *H01L 2224/13169* (2013.01); *H01L 2224/13171* (2013.01); *H01L 2224/16145* (2013.01); *H01L 2224/81201* (2013.01)

(58) Field of Classification Search
CPC ........................................................ H01L 24/16
See application file for complete search history.

(56) References Cited

U.S. PATENT DOCUMENTS

| | | | |
|---|---|---|---|
| 6,811,892 B2 * | 11/2004 | Yeh ...................... | B23K 35/262 228/262.9 |
| 10,651,233 B2 * | 5/2020 | Hartman ................ | H10N 60/80 |
| 2011/0079894 A1 | 4/2011 | Markunas et al. | |
| 2011/0304058 A1 | 12/2011 | Pendse | |
| 2012/0111922 A1 * | 5/2012 | Hwang .................. | B23K 1/203 228/6.2 |
| 2014/0246763 A1 | 9/2014 | Bunyk | |
| 2017/0373044 A1 | 12/2017 | Das et al. | |
| 2018/0013052 A1 | 1/2018 | Oliver et al. | |

(Continued)

FOREIGN PATENT DOCUMENTS

WO     2020185336 A1    9/2020

OTHER PUBLICATIONS

International Search Report and Written Opinion for corresponding PCT/US2023/017461, dated Jul. 31, 2023, pp. 1-10.

*Primary Examiner* — William A Harriston
(74) *Attorney, Agent, or Firm* — Tarolli, Sundheim, Covell & Tummino LLP

(57) ABSTRACT

A method of forming a multi-chip system is disclosed. The method includes forming one or more bumps on respective conductive contact pads of a first electronic device, forming one or more mini-bumps on respective conductive contact pads of a second electronic device, and aligning respective one or more mini-bumps with respective one or more bumps. The method further includes performing a bump bonding process that exerts compression force on one or both the first electronic device and the second electronic device to compress the one or more mini-bumps into the one or more bumps to form one or more bump bond structures that bond the second electronic device to the first electronic device.

20 Claims, 4 Drawing Sheets

(56) References Cited

U.S. PATENT DOCUMENTS

2018/0269177 A1   9/2018  Yang
2019/0131510 A1   5/2019  Abraham et al.
2021/0272921 A1*  9/2021  Arifeen ................... H01L 24/13
2022/0013492 A1*  1/2022  Huang .................... H01L 24/81
2022/0238480 A1*  7/2022  Zhan ....................... H01L 24/16

* cited by examiner

BUMP STRUCTURES FOR LOW TEMPERATURE CHIP BONDING

GOVERNMENT INTEREST

The invention was made under Government Contract. Therefore, the US Government has rights to the invention as specified in that contract.

TECHNICAL FIELD

The present invention relates generally to chip bonding, and more particularly to bump bond structures for multi-chip bonding.

BACKGROUND

In many large electronic applications it is desirable to connect integrated circuit (IC) devices together for adding functionality and/or for increasing capacity. These IC devices are typically connected to one another through bump bonds. Bump bonding is a common technique in industry for packaging integrated circuits. Gold is employed not only for electrical signal transfer between devices but for the thermal transfer of heat to and from devices. Typical industrial processes implement large bump bonds (50-100 μm diameter/thickness), and high temperatures of 300-450° C. combined with high pressure to obtain a robust metallic bond. However, in certain low temperature applications, high temperatures can damage certain components on the IC. Therefore, these gold bonding processes are not compatible with these type of devices.

SUMMARY

In one example, a method of forming a multi-chip system is disclosed. The method comprises forming one or more bumps on respective conductive contact pads of a first electronic device, forming one or more mini-bumps on respective conductive contact pads of a second electronic device, and aligning respective one or more mini-bumps with respective one or more bumps. The method further comprises performing a bump bonding process that exerts compression force on one or both the first electronic device and the second electronic device to compress the one or more mini-bumps into the one or more bumps that form one or more bump bond structures to bond the second electronic device to the first electronic device.

In yet another example, a multi-chip system is disclosed that comprises a first electronic device having a plurality of first conductive contact pads disposed on a top side of a first electronic device, and a second electronic device having a plurality of second conductive contact pads disposed on a bottom side of a second electronic device. The multi-chip system further comprises a plurality of bump bond structures with a given bump bond structure coupling respective conductive contact pads of the plurality of first conductive contact pads to respective conductive contact pads of the second plurality of conductive pads to bond the first electronic device to the second electronic device, where each of the plurality of bump bond structures comprising a mini-bump compressed into a bump.

DETAILED DESCRIPTION

Figure 1:
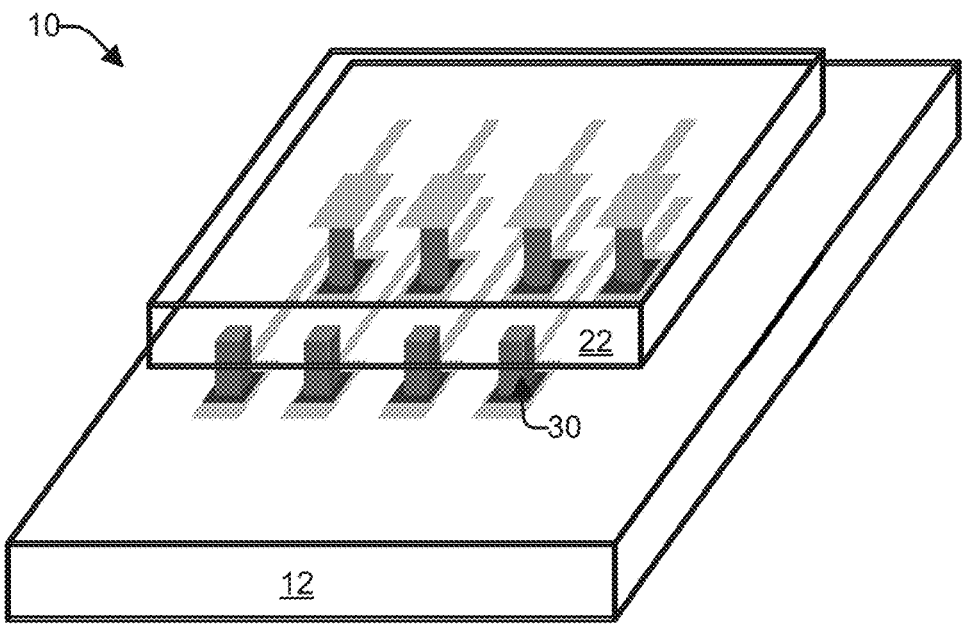
FIG. 1 illustrates a perspective view of a multi-chip system.

The present disclosure relates to the forming of multi-chip systems from two or more electronic devices (e.g., integrated circuits). The two or more electronic devices are electrically and/or mechanically coupled to one another via bump bond structures (e.g., gold, copper). The bump bond structures can be conductive or non-conductive. The bump bond structures can carry electrical signals or function as stand-offs that do not carry signals but do bond electronic devices to one another. In one example, each bump bond structure is formed of a mini-bump compressed into a bump via a low temperature thermo-compression flip-chip bonding process. In certain applications, circuitry may be temperature sensitive or contain low temperature solder interconnects (e.g., indium or indium alloys) that limit the upper process temperature to about 50° C. to about 250° C. (e.g. 150° C.), and/or may include architectures that do not support large bump bonds. The present disclosure addresses limitations of bump bonding that uses high process temperatures (e.g., 300° C.-450° C.) and/or much larger bump bond structures that are not compatible with circuitry that is temperature sensitive or that requires fine pitch interconnects. In one example, the structure and process enables the formation of gold interconnects alongside indium or indium alloy interconnects in the same flip-chip bonding process under low temperature requirements (e.g., less than or equal to 150° C.).

In one example, one or more mini-bumps are fabricated on a first electronic device (e.g., a top integrated circuit chip) and one or more respective regular bumps are fabricated on a second electronic device (e.g., a bottom substrate/integrated circuit chip). The first electronic device is placed over the second electronic device and the one or more mini-bumps are driven into the one or more respective bumps by compression during a bump bond process creating uniform connections between the first and second electronic devices. Additionally, one or more low melting temperature bumps can be fabricated on one of the first electronic device and/or second electronic device for providing electrical connections between the electronic devices. A low melting temperature bump bond is defined as a bump bond with a melting temperature at about 50° C. to about 250° C. (e.g. 150° C.). This process allows the concurrent flip-chip bump bonding of two completely different interconnects composed of different materials: bumps (e.g., gold or copper) and low melting temperature bumps (e.g., indium/indium alloy bumps).

In yet another example, a bump bond structure consists of a conductive pad, or bump, which is about 3 μm thick with about a 10 μm×10 μm area on a bottom substrate compression bonded to a mini-bump on the top chip which is about 2 μm thick and about 2 μm×2 μm in area. The mini-bump is compressed into the conductive pad or bump with sufficient applied compression force in the bonding process, creating a robust mechanical joint and low-resistance electrical contact via, for example, a cold weld. The bonding process can be carried out at 150° C. which may be beneficial to protect temperature sensitive devices. The structure and bonding process is not only applicable to conductive materials such as gold or copper, but may be used with other conductive or non-conductive materials.

Figure 2:
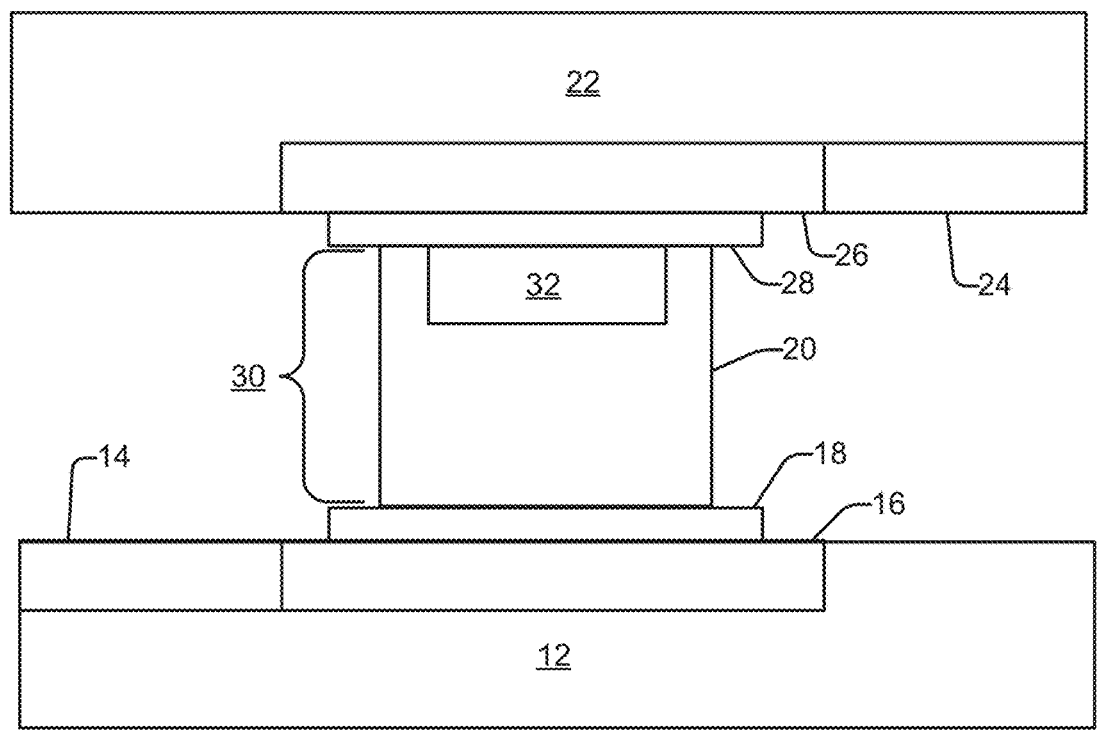
FIG. 2 illustrates a schematic cross-sectional view of a bump bond structure.

FIG. 1 illustrates a perspective view of an example of a multi-chip system 10. FIG. 2 illustrates a schematic cross-sectional view of an example bump bond structure 30 of the multi-chip system 10. The multi-chip system 10 includes a first electronic device 12 (e.g., bottom device or main device) connected to a second electronic device 22 (e.g., top device or auxiliary device), through a plurality of bump bond structures 30. Although a single electronic device is shown as a top device, a number of top devices could be coupled to one bottom or main device. An electronic device can be a substrate wafer, a package device for passing signals to another device, an integrated circuit (IC), or a variety of other types of electronic devices.

The first electronic device 12 includes a plurality of first conductive contact pads 16 disposed on a top side of the first electronic device 12. Each of the plurality of the first conductive contact pads 16 are coupled to respective conductive lines 14 that electrically couple the respective first conductive contact pad 16 to other electrical elements such as vias and/or circuitry within the first electronic device 12. The second electronic device 22 includes a plurality of second conductive contact pads 26 disposed on a bottom side of the second electronic device 22. Each of the plurality of second conductive contact pads 26 are coupled to respective conductive lines 24 that electrically couple the respective second conductive contact pads 26 to other electrical elements such as vias and/or circuitry within the second electronic device 22. The first electronic device 12 is electrically and mechanically coupled to the second electronic device 22 by a plurality of bump bond structures 30 that bond the devices to one another through corresponding conductive contact pads of the first and second electronic devices 12 and 22, respectively.

Referring to FIG. 2, a given bump bond structure of the plurality of bump bond structures 30 is formed of a mini-bump 32 compressed into a (larger) bump 20. The bump bond structure 30 overlies a first UBM layer 18 at the bump 20 end and a second UBM layer 28 at the mini-bump 32 end. The first UBM layer 18 overlies a given first conductive contact pad of the plurality of first conductive contact pads 16, and the second UBM layer 28 overlies a given second conductive contact pad of the plurality of second conductive contact pads 26. The first UBM layer 18 and the second UBM layer 28 are optional based on the material of the bump bond structure and promote adhesion and/or act as a barrier layer to prevent the formation of native oxide which naturally occur for most metals, and can be formed from one or more metals including, but not limited to gold, titanium, chromium, platinum, or a combination thereof. The bump bond structure 30 can be formed of a conductive metal such as gold or copper, or a non-conductive material when not being employed to carry electrical or thermal energy. The bump bond structure 30 can be configured for mechanical attachment and/or to transfer electrical signals and/or thermal energy.

In one example, the first UBM layer 18 and the second UBM layer 28 can each have a thickness of 100 Å to about 5000 Å. In one example, the first UBM layer 18 and the second UBM layer 28 can each be formed of titanium/gold stack with a thickness of 350 Å/3000 Å. The bump bond structure 30 can be formed of gold. Prior to compression bonding, the bump 20 can be 10 μm×10 μm (surface area of 100 μm$^2$) and 3 μm tall. The mini-bump 32 can be 2 μm×2 μm (surface area of 4 μm$^2$) and 2 μm tall. This provides for the ratio in surface area of about 25:1 between the bump 20 and the mini-bump 32. In one example, the second electronic device 22 and the first electronic device 12 can be bonded using a thermo-compression flip-chip process at 150° C., where a large bonding force is initially applied to drive the mini-bump 32 into the larger bump 20. Once the mini-bump 32 is completely driven into the larger bump 20 and/or crushed, the increase in surface contact area from the larger bump 20 decreases the applied force per unit area by a factor of about 25×, thus avoiding compression of the larger bump 20. Now the larger bump 20 acts as a stop to maintain a fixed separation between the first electronic device 12 and second electronic device 22.

Although the present example, illustrates a surface area of about 25:1, other surface area ratios (e.g., 10:1, 20:1, 30:1, 40:1, 50:1) can be employed based on the compression force applied in the flip chip bonding process. Furthermore, the thickness of the mini-bump and the larger bump may vary based on a particular design and temperature.

Turning now to FIGS. 3-6, fabrication is discussed in connection with formation of a bump bond structure similar to that illustrated in FIGS. 1-2. It is to be appreciated that the present example is discussed with respect to a process flow of forming bump bond structures to bond two electronic devices to one another. The process flow starts with the providing of a first electronic device (e.g., a wafer having a number of first ICs, a first IC) with a top side of conductive contact pads and with the providing of a second electronic device (e.g., second IC) with a bottom side of conductive contact pads. The present example will be further illustrated with respect to the deposition of a UBM metal layer on the conductive contact pads to provide an adhesion layer between the conductive contact pad and a bonding layer for the bump bond structure.

Figure 3:
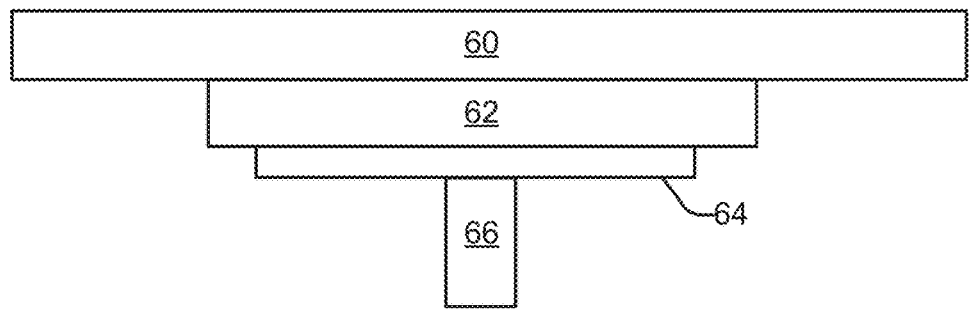
FIG. 3 illustrates a cross-sectional view of a multi-chip system in its early stages of fabrication with a mini-bump of a second electronic device being aligned with a conductive bump of a first electronic device.
Figure 3:
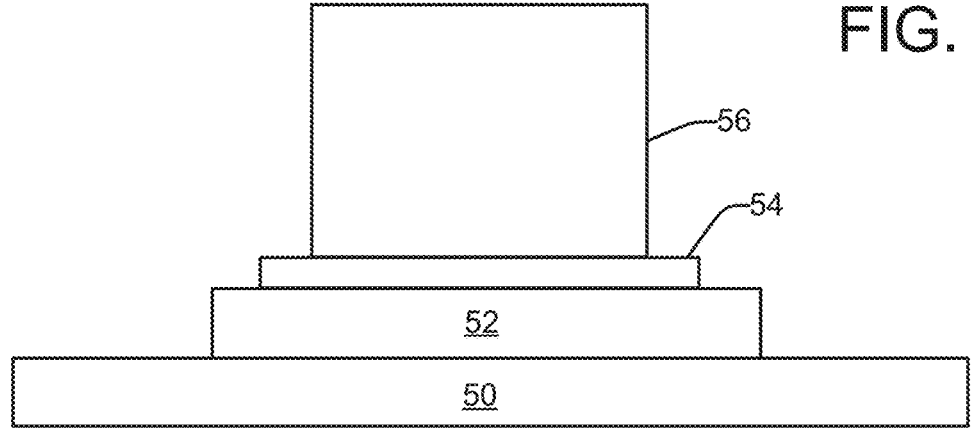

FIG. 3 illustrates a cross-sectional view of a multi-chip system in its early stages of fabrication. The multi-chip system includes a first electronic device 50 (e.g., a first IC or a first substrate wafer) that can include conventional and/or conductive circuitry for executing a number of circuit functions. Portions of the circuitry or vias can be connected to one or more first conductive contact pads 52, via one or more conductive lines (not shown), for sharing functionality and/or signals with a second electronic device 60. The one or more conductive contact pads 52 can be formed of a conductive metal, including but not limited to gold or copper. The first electronic device 50 can be a first substrate wafer having a plurality of first ICs to be cut from the first substrate wafer into individual first ICs, or the first electronic device 50 can be a first IC. For illustrative purposes, the description will refer to a first electronic device 50 as opposed to a first IC or a first substrate wafer.

The second electronic device 60 (e.g. a second IC or second substrate wafer) can include conventional and/or conductive circuitry for executing a number of circuit functions. Portions of the circuitry can be connected to one or more conductive contact pads 62, via one or more conductive lines (not shown), for sharing functionality and/or signals with one or more other ICs. The one or more conductive contact pads 62 can be formed of a conductive metal, such as gold or copper. The second electronic device 60 can be a second substrate wafer that can include a plurality of second ICs to be cut from the second substrate wafer into individual second ICs, or a second IC.

The one or more conductive contact pads 52 on the top side of the first electronic device 50 each include an overlying first UBM layer(s) 54. The first UBM layer(s) 54 can be a metal layer that has a thickness of about 100 Å to about 5000 Å and promotes adhesion and/or act as a barrier to prevent the formation of native oxide which naturally occur for most metals. Additionally, the first UBM layer 54 can be formed from a metal including, but not limited to gold, titanium, chromium, platinum, or a combination thereof. The thickness of the first UBM layer 54 can be selected such that the first UBM layer 54 can have conductive properties similar to the one or more conductive contact pads 52. The first UBM layer(s) 54 can be deposited employing a standard contact material deposition such as evaporation, or sputtering.

The one or more conductive contact pads 62 on the bottom side of the second electronic device 60 each include an underlying second UBM layer(s) 64. The second UBM layer(s) 64 can be one or more metal layers that have a combined thickness of about 100 Å to about 5000 Å and promotes adhesion and/or act as a barrier to prevent the formation of native oxide which naturally occur for most metals. Additionally, the second UBM layer(s) 64 can be formed from one or more metals including, but not limited to gold, titanium, chromium, platinum, or a combination thereof. The thickness of the second UBM layer(s) 64 can be selected such that the second UBM layer(s) 64 can have conductive properties similar to the one or more conductive contact pads 62. The second UBM layer(s) 64 can be deposited employing a standard contact material deposition such as evaporation, or sputtering.

In the present example, a single bump bond structure is formed for illustrated purposes although multiple bump bond structures will be formed in a bump bond process. The present example will refer to a conductive bump bond structure, although the process can be employed for non-conductive bump bond structures that form spacers or stand-offs. The first electronic device 50 includes a conductive bump 56 residing over the first UBM layer 54, and the second electronic device 60 includes a conductive mini-bump 66 residing under or on the second UBM layer 64. The surface area of the conductive bump 56 relative to the surface area of the conductive mini-bump 66 have a surface area ratio from about 10:1 to about 50:1 (e.g., about 25:1). The conductive bump 56 can have a height (e.g., 3 μm) that is higher than the height of the conductive mini-bump 66 (e.g., 2 μm).

Figure 4:
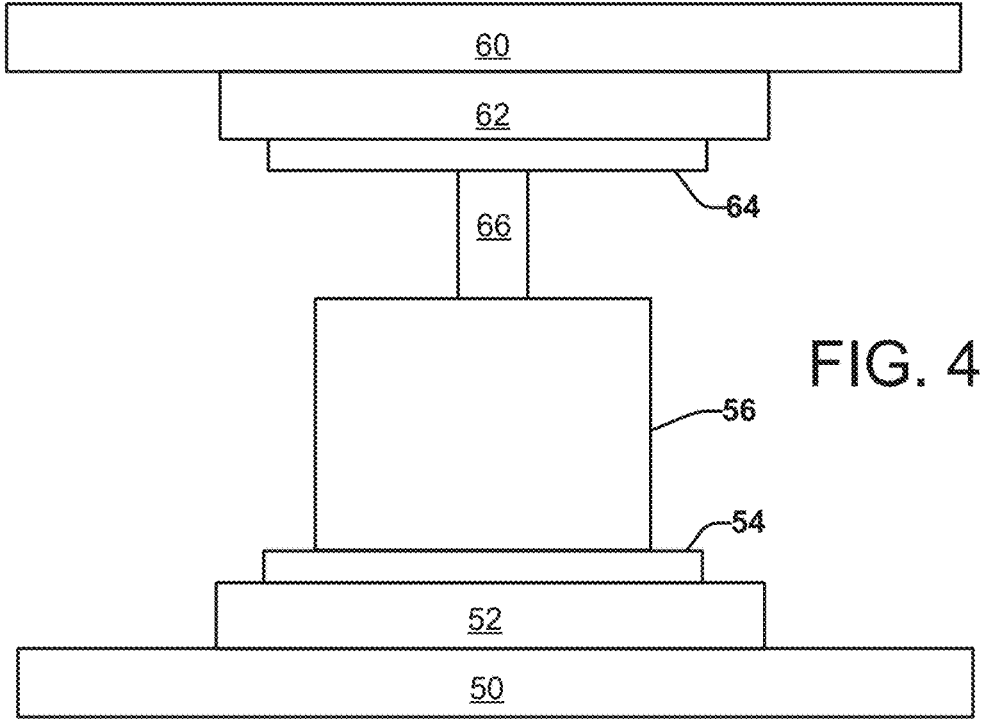
FIG. 4 illustrates a schematic cross-sectional view of a mini-bump of the second electronic device being moved into contact with the conductive bump of the first electronic device while undergoing a bump bond compression process.

Next, as illustrated in FIG. 4, the first electronic device 50 and the second electronic device 60 undergo a bump bonding process in which an outer bottom surface of the conductive mini-bump 66 of the second electronic device 60 is moved into contact with an outer top surface of the conductive bump 56 of the first electronic device 50. This can be accomplished in relatively low temperature environment, for example, about 50° C. to about 250° C. (e.g. 150° C.) compared to typical bonding temperature (e.g., 300° C.-450° C.) of the conductive materials (e.g., gold, copper) of the conductive bump 56 and the conductive mini-bump 66. As shown in FIG. 4, a compression force 100 is exerted on a top side of the second electronic device 60 to begin the compression of the conductive mini-bump 66 into the conductive bump 56. The compression force can be in the range of about 50 newton to about 250 newton (e.g., 150 newton). Alternatively, the compression force can be exerted from the bottom of the first electronic device 50 or a combination of force exerted from both the top surface of the second electronic device 60 and the first electronic device 50.

Figure 5:
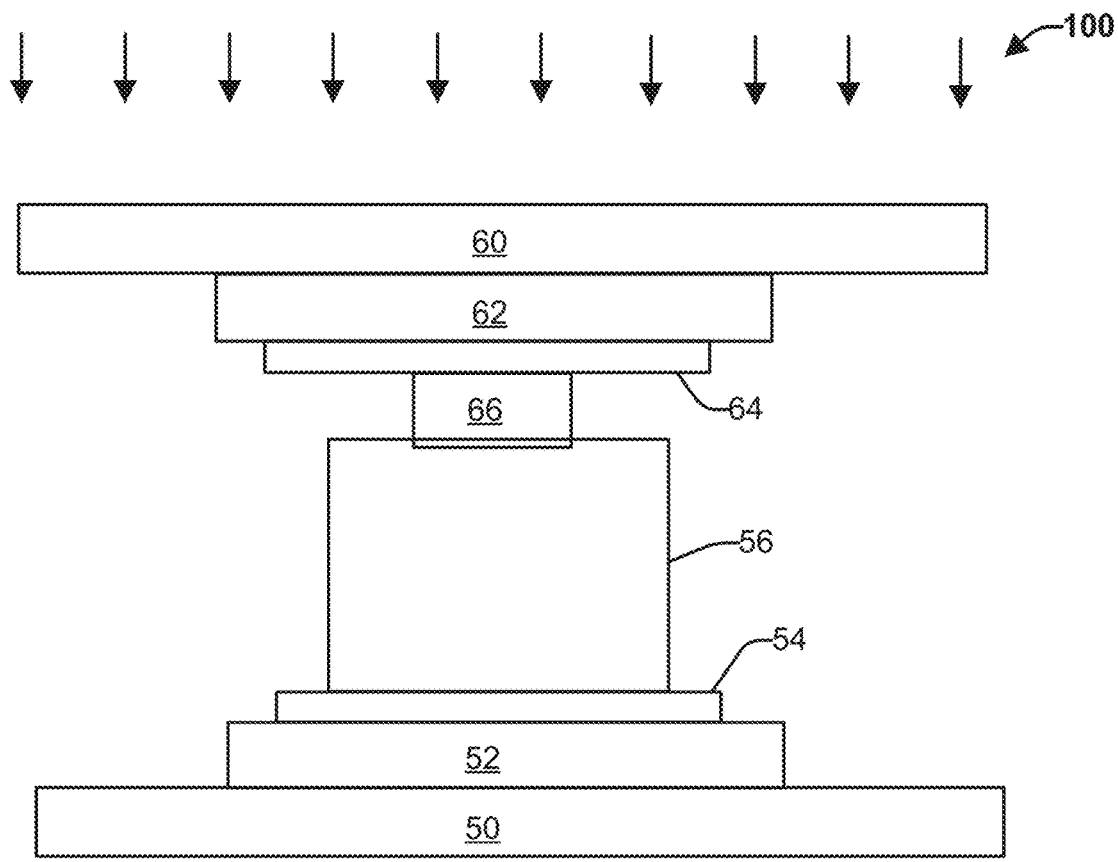
FIG. 5 illustrates a schematic cross-sectional view of the partial compression of the mini-bump into the conductive bump as the compression force continues to be exerted on the top side of the second electronic device.
Figure 6:
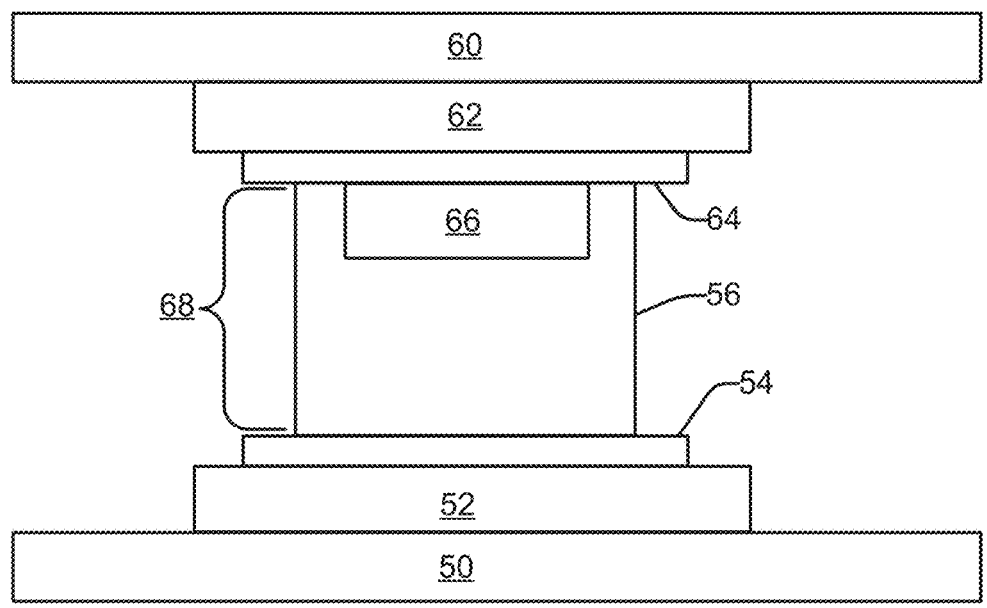
FIG. 6 illustrates a schematic cross-sectional view of the complete compression of the mini-bump into the conductive bump to form a bump bond structure.

FIG. 5 illustrates the partial compression of the conductive mini-bump 66 into the conductive bump 56 as the compression force 100 continues to be exerted on the top side of the second electronic device 60. As the conductive mini-bump 66 compresses, the surface area of the conductive mini-bump 66 increases relative to the conductive bump 56 resulting in the redistribution of the pressure over the increased surface area. Finally, as illustrated in FIG. 6, the conductive mini-bump 66 completed compresses into the conductive bump 56 to form a bump bond structure 68 resulting in the redistributing of the pressure from a surface area ratio of about 25:1 to about 1:1. As a result, the conductive bump 56 acts as a stop given the compression force 100 is selected such that the conductive bump 56 will not be compress upon the complete compression of the conductive mini-bump 66. The final structure is the bump bond structure 68 that is a cold weld of the conductive mini-bump 66 and the conductive bump 56.

The compression bonding process that forms the bump bond structure 68 from the combination of the conductive mini-bump 66 and the conductive bump 56 can be combined with other bump bond structures and processes. For example, the bump bond structure 68 and process can be combined with a bump bond process of forming low melting temperature bump bond structures.

Figure 7:
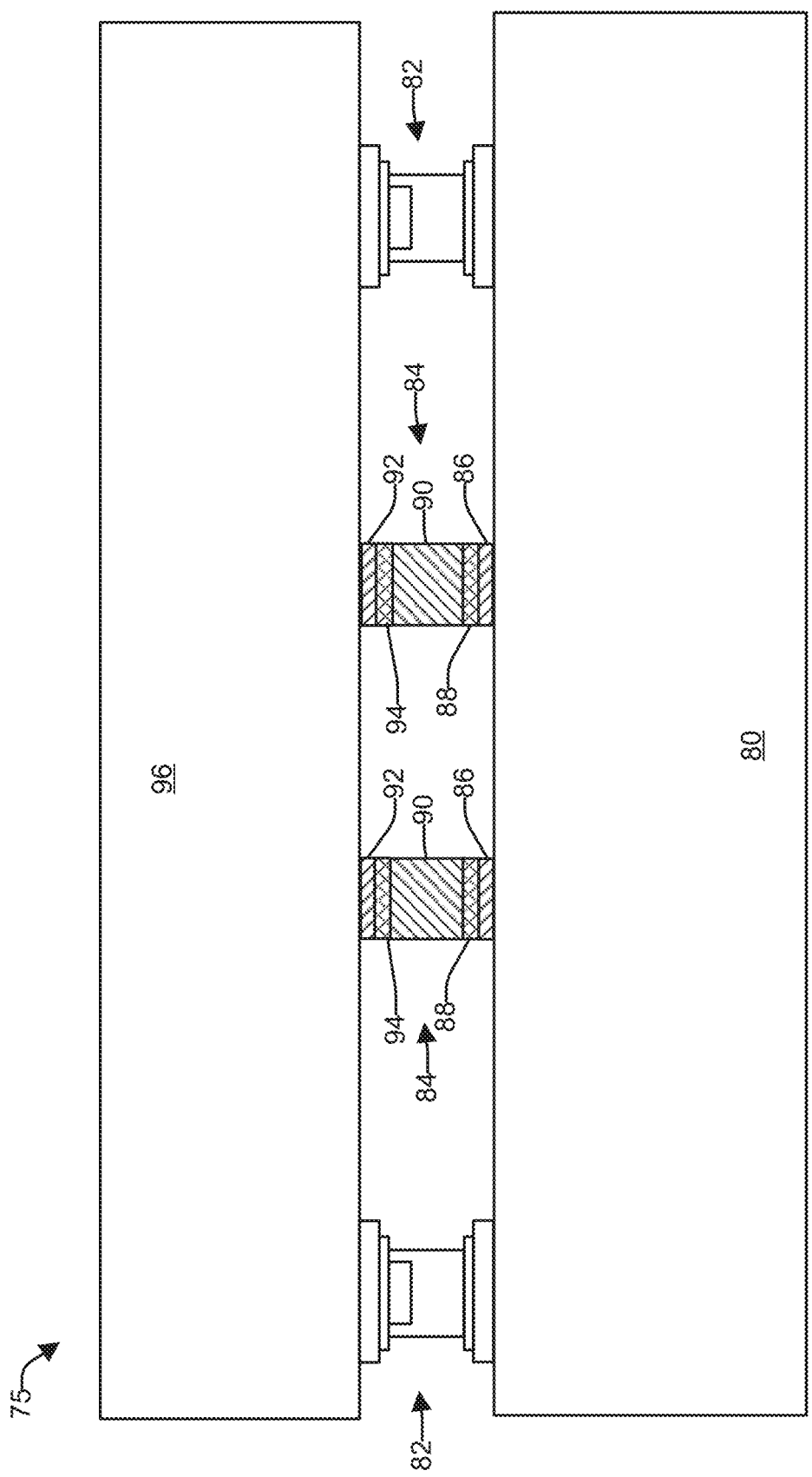
FIG. 7 illustrates a schematic cross-sectional view of a multi-chip system that includes both bump bond structures and low temperature bump bond structures coupling a second electronic device to a first electronic device.

FIG. 7 illustrates a cross-sectional view of a multi-chip system 75 that employs both bump bond structures and low melting temperature bump bond structures. The multi-chip system 75 includes a first electronic device 80 (e.g., bottom device or main device) connected to a second electronic device 96 (e.g., top device or auxiliary device), through a plurality of bump bond structures 82 and a plurality of low melting temperature bump bond structures 84. Although the second electronic device 96 is shown as a top device, a number of top devices could be coupled to one bottom or main device. An electronic device can be a substrate wafer, a package device for passing signals to another device, an integrated circuit (IC), or a variety of other types of electronic devices.

Each of the bump bond structures 82 are formed of a mini-bump compressed into a bump as shown in FIGS. 2 and 6. Each of the low melting temperature bump bond structures 84 are formed of a first UBM layer 88 that overlies a first contact pad 86, a second UBM layer 94 that overlies a second contact pad 92 and a low melting temperature bump layer 90 that couples the first UBM layer 88 to the second UBM layer 94. The first UBM layer 88 and the second UBM layer 94 promote adhesion and/or act as a barrier layer to prevent the formation of native oxide which naturally occur for most metals, and can be formed from a metal including, but not limited to gold, titanium, chromium, platinum, or a combination thereof.

In one example, the low melting temperature bump bond structures 84 are formed of indium. The indium bump bond structures can readily bond the first electronic device 80 and second electronic device 96 at a temperature of about 150° C. or less and can be bonded concurrently as the bump bond structures 82 are being formed by compression of the mini-bump into a larger bump as illustrated in the process shown in FIGS. 3-6. The bump bond structures can be formed of a conductive material such as gold or copper or a non-conductive material. Furthermore, a number of other materials and low melting temperature materials can be employed to provide the bump bond structures and the low melting temperature bump bond structures as shown in FIG. 7.

For purposes of simplification of explanation, the terms "overlay", "overlaying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation are for purposes of illustration. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A method of forming a multi-chip system, the method comprising:
    forming a first under bump metallization (UBM) layer on respective conductive contact is of a first electronic device:
    for a second UBM layer on respective conductive contact pads of a second electronic device
    forming one or more bumps on the first UBM layer of the first electronic device;
    forming one or more mini-bumps the second UBM layer of the second electronic device;
    aligning respective one or more mini-bumps with respective one or more bumps; and
    performing a bump bonding process that exerts compression force on one or both the first electronic device and the second electronic device to compress the one or more mini-bumps into the one or more bumps to form one or more bump bond structures that bond the second electronic device to the first electronic device.

2. The method of claim 1, wherein the temperature of the bump bonding process is less than or equal to 150° C.

3. The method of claim 1, wherein each of the one or more bumps and the one or more mini-bumps are formed from a material selected from a group comprising gold, copper or a non-conductive material.

4. The method of claim 1, wherein an initial surface area of a given bump of the one or more bumps relative to a given mini-bump of the one or more mini-bumps, prior to performing the bump bonding process, ranges from about 10:1 to about 50:1.

5. The method of claim 4, wherein the initial surface area of the given bump of the one or more bumps relative to the given mini-bump of the one or more mini-bumps, prior to performing the bump bonding process, is about 25:1.

6. The method of claim 1, wherein the compression force of the bump bonding process is selected to allow for each of the one or more bumps to act as compression stops once the respective one or more mini-bumps are substantially compressed into the respective one or more bumps.

7. The method of claim 1, wherein each of the first and second UBM layers have a thickness between about 100 Å to about 5000 Å to promote adhesion and to provide similar properties as the underlying conductive contact pad.

8. The method of claim 1, wherein each of the first UBM layer and the second UBM layer can be formed of a titanium/gold stack with a thickness of 350 Å /3000 Å.

9. The method of claim 1, wherein each of the first and second UBM layers are formed from one or more conductive materials selected from the group comprising gold, titanium, chromium, and platinum.

10. The method of claim 1, further comprising forming one or more low melting temperature bump bond structures between the first electronic device and the second electronic device concurrently with the forming of the one or more bump bond structures.

11. The method of claim 10, wherein each of the one or more low melting temperature bump bond structures are formed from indium.

12. A multi-chip system comprising:
    a first electronic device having a plurality of first conductive contact pads disposed on a top side of a first electronic device;
    a second electronic device having a plurality of second conductive contact pads disposed on a bottom side of a second electronic device;
    a first under bump metallization (UBM) layer disposed on respective conductive contact pads of the first electronic device:
    a second UBM layer disposed of respective conductive contact pads of the second electronic device; and
    a plurality of bump bond structures with a given bump bond structure coupling the first UBM layer and respective conductive contact pads of the plurality of first conductive contact pads to the second UBM layer and respective conductive contact pads of the second plurality of conductive pads to bond the first electronic device to the second electronic device, each of the plurality of bump bond structures comprising a mini-bump compressed into a bump.

13. The system of claim 12, wherein the bump and the mini-bump of each of the plurality of bump bond structures are selected from a group comprising gold, copper or a non-conductive material.

14. The system of claim 12, wherein an initial surface area of a given bump of the plurality of bump bond structures relative to a given mini-bump of the plurality of bump bond structures, prior to the respective mini-bumps being compressed into respective bumps, ranges from about 10:1 to about 50:1.

15. The system of claim 12, wherein each of the first and second UBM layers have a thickness between about 100 Å to about 5000 Å to promote adhesion and to provide similar properties as the underlying conductive contact pad.

16. The system of claim 12, wherein the first and second UBM layers are formed from one or more conductive materials selected from the group comprising gold, titanium, chromium, and platinum.

17. The system of claim 12, further comprising one or more low melting temperature bump bond structures coupling the first electronic device and the second electronic device.

18. The system of claim 17, wherein each of the one or more low melting temperature bump bond structures are formed from indium.

19. A method of forming a multi-chip system, the method comprising:

forming one or more bumps on respective conductive contact pads of a first electronic device;

forming one or more mini-bumps on respective conductive contact pads of a second electronic device;

aligning respective one or more mini-bumps with respective one or more bumps;

performing a bump bonding process that exerts compression force on one or both the first electronic device and the second electronic device to compress the one or more mini-bumps into the one or more bumps to form one or more bump bond structures that bond the second electronic device to the first electronic device; and forming one or more low melting temperature bump bond structures between the first electronic device and the second electronic device concurrently with the forming of the one or more bump bond structures.

20. The method of claim 19, wherein each of the one or more low melting temperature bump bond structures are formed from indium.

\* \* \* \* \*